US005623363A

United States Patent [19]
Liou

[11] Patent Number: 5,623,363
[45] Date of Patent: Apr. 22, 1997

[54] SEMICONDUCTOR LIGHT SOURCE HAVING A SPECTRALLY BROAD, HIGH POWER OPTICAL OUTPUT

[75] Inventor: Kang-Yih Liou, Holmdel, N.J.

[73] Assignee: Lucent Technologies Inc., Murray Hill, N.J.

[21] Appl. No.: 395,219

[22] Filed: Feb. 27, 1995

[51] Int. Cl.$^6$ .............................. A01S 3/00; G02B 6/12
[52] U.S. Cl. .......................... 359/344; 359/188; 385/14
[58] Field of Search .................................. 359/344, 341, 359/340, 180, 188; 372/50; 385/14

[56] References Cited

U.S. PATENT DOCUMENTS

| | | | |
|---|---|---|---|
| 4,977,567 | 12/1990 | Hanke | 372/45 |
| 5,003,550 | 3/1991 | Welch et al. | 372/50 |
| 5,005,212 | 4/1991 | Wood | 455/606 |
| 5,175,643 | 12/1992 | Andrews | 359/339 |
| 5,311,344 | 5/1994 | Bohn et al. | 359/125 |
| 5,349,601 | 9/1994 | Mehuys et al. | 372/98 |
| 5,440,576 | 8/1995 | Welch et al. | 372/50 |

OTHER PUBLICATIONS

"High Power Superluminescent Diode Source", L. Goldberg et al., *Electronics Letters*, vol. 30, No. 20, Sep. 29, 1994, pp. 1682–1684.

"Demonstration of a Cost-Effective, Broadband Passive Optical Network System", T.H. Wood et al., *IEEE Photonics Technology Letters*, vol. 6, No. 4, Apr. 1994, pp. 575–578.

"A superluminescent Diode at 1.3 µm with Very Low Spectral Modulation", B. D. Patterson et al., *IEEE Journal of Quantum Electronics*, vol. 30, No.3, Mar. 1994, pp. 703–712.

"Multiple-Quantum-Well GaInAs/GaInAsP Tapered Broad-Area Amplifiers with Monolithically Integrated Waveguide Lens for High-Power Applications", F. Koyama et al., *IEEE Photonics Technology Letters*, vol. 5, No. 8, Aug. 1993, pp. 916–919.

"Performance and Reliability of InGaAsP Superluminescent Diode", Y. Kashima et al., *Journal of Lightwave Technology*, vol. 10, No. 11, Nov. 1992, pp. 16–44–49.

"Lightwave Systems With Optical Amplifiers", N.A. Olsson, *Journal of Lightwave Technology*, vol. 7, No. 7, Jul. 1989, pp. 1071–1082.

"Semiconductor Laser Optical Amplifiers For Use In Future Fiber Systems", M. J. O'Mahony, *Journal of Lightwave Technology*, vol. 6, No. 4, Apr. 1988, pp. 531–544.

*Long-Wavelength Semiconductor Lasers*, G.P. Agrawal and N.K. Dutta, Van Nostrand Reinhold Company, NY, Copyright 1986, Chapter 5, pp. 172–177.

Co-pending United States Patent Application Serial No. 08/, filed Feb. 27, 1995, entitled "Passive Optical Network Having Amplified LED Transmitters", (R.D. Feldman—K-Y Liou case 3–10).

*Primary Examiner*—Mark Hellner
*Attorney, Agent, or Firm*—Brian K. Dinicola

[57] ABSTRACT

A light source includes a light emitting diode and an optical fiber having a first end coupled to the output of the light emitting diode. A single or multiple transverse mode optical semiconductor amplifier has an input coupled to a second end of the optical fiber. The light source may be fabricated from discrete components or alternatively it may be fabricated as a monolithically integrated device.

48 Claims, 4 Drawing Sheets

STMO AMPLIFIER

"EMBH"

SEMICONDUCTOR LIGHT SOURCE HAVING A SPECTRALLY BROAD, HIGH POWER OPTICAL OUTPUT

TECHNICAL FIELD

This invention relates generally to semiconductor light sources and more particularly to a semiconductor light source having a spectrally broad, high power output.

BACKGROUND OF THE INVENTION

High power semiconductor light sources such as lasers provide high output power over a relatively narrow optical spectrum. Other semiconductor light sources such as light emitting diodes (LEDs) and superluminescent LEDs provide low output power over a relatively broad optical spectrum. For example, lasers can typically couple about a few milliwatts of power into a single mode optical fiber over a spectrum that consists of discrete longitudinal modes that each have a linewidth of less than one angstrom. Commercially available LEDs, on the other hand, can typically couple only about 100 microwatts into an optical fiber, but over a continuous optical spectrum that is 500–1000 angstroms in width.

A semiconductor light source that operates at high output power over a broad optical spectrum is shown in Goldberg et al., *Electron. Lett.*, 1994, 30, (20), pp. 1682–1684. As seen in FIG. 1 of Goldberg, the output from a superluminescent LED is coupled via a lens into a broad area amplifier.

SUMMARY OF THE INVENTION

The inventor has recognized that the previously-referenced light source to Goldberg et al. exhibits several deficiencies which make it unsuitable for various applications, particularly in communication systems. For example, broad area amplifiers do not provide waveguiding in the transverse direction (i.e., the direction in plane of the amplifier perpendicular to the optical propagation direction). As a result, optical coupling between the amplifier output and a single mode optical fiber occurs in an inefficient manner and requires a bulky lens system situated between the amplifier and fiber. Moreover, a large component of the output from broad area amplifiers is due to amplified spontaneous emission and this leads to an undesirably small optical modulation index or signal to noise extinction ratio. Finally, broad-area tapered amplifiers require large input modulation currents due to their large size and are limited to operation at low modulation frequencies due to their large capacitance.

Therefore, in accordance with the present invention, a light source has been developed which overcomes the deficiencies noted above. The light source includes a light emitting diode and an optical fiber having a first end coupled to the output of the light emitting diode. A single or multiple transverse mode optical semiconductor amplifier has an input coupled to a second end of the optical fiber. The light source may be fabricated from discrete components or alternatively it may be fabricated as a monolithically integrated device.

BRIEF DESCRIPTION OF THE DRAWINGS

FIG. 3(a) shows the optical output power from the amplifier versus LED injection current at various amplifier bias currents for one embodiment of the invention while FIG. 3(b) shows the optical output power after it is coupled to a single mode fiber that is connected to the amplifier output.

DETAILED DESCRIPTION

Figure 1:
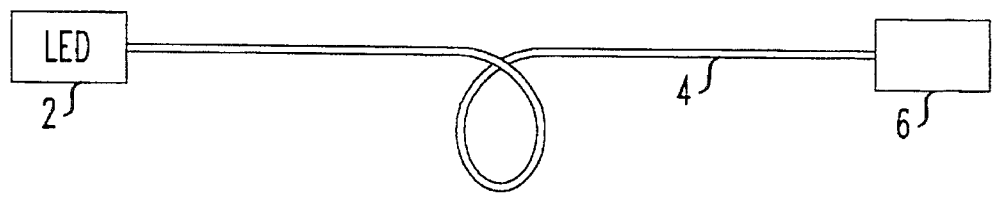
FIG. 1 shows a schematic illustration of semiconductor light source in accordance with the present invention.

FIG. 1 shows a schematic illustration of a high power semiconductor light source in accordance with the present invention that provides a high power, spectrally broad, optical output. The output of an edge-emitting LED 2 is coupled to one end of an optical fiber 4. The remote end of the fiber 4 is in turn coupled to a single or multimode transverse mode optical (STMO or MTMO) semiconductor amplifier 6. In contrast to the broad-area amplifier employed by Goldberg, the STMO or MTMO amplifiers employed in the present invention provide transverse waveguiding of the optical signal. If an STMO amplifier is used in the inventive semiconductor light source, the optical fiber is preferably a single mode fiber. Similarly, if an MTMO amplifier is employed, the optical fiber is preferably a multimode fiber to ensure efficient optical coupling.

Figure 2:
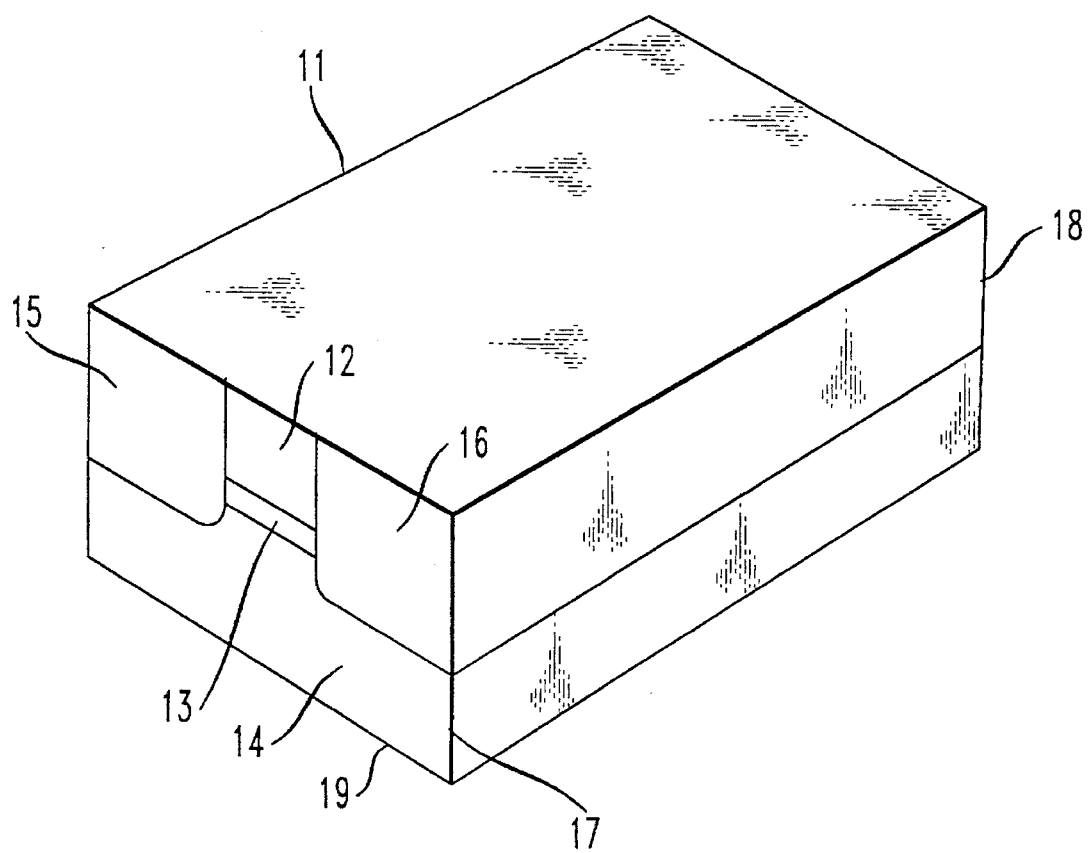
FIG. 2 shows an example of a single transverse mode optical amplifier that may be employed in the light source shown in FIG. 1.

The STMO amplifier 6 is fabricated from a single transverse mode semiconductor laser. An antireflective coating is applied to the laser facets to suppress laser oscillations. The present invention may employ an STMO amplifier fabricated from any single transverse mode semiconductor laser. Examples of appropriate laser structures are disclosed in M. J. O'Mahony, Journal of Lightwave Technology, vol. 6, p. 531, 1988 and N. A. Olsson. Journal of Lightwave Technology, vol. 7, p. 1071, 1989. One example of a STMO amplifier is shown in FIG. 2. The amplifier is fabricated by applying anti-reflective (AR) coatings to the cleaved facets 17 and 18 of a semiconductor laser. The AR coating can be a dielectric layer of silicon oxide, for example. The thickness of the dielectric layer is equal to one-quarter the wavelength of the light propagating in the structure. An active guide layer 13 is sandwiched between cladding layers 12, 14, 15, and 16. Cladding layer 12 is doped p-type while cladding layer 14 is doped n-type. Cladding layers 15 and 16 serve as current blocking layers. The refractive index of the active guide layer 13 is larger than the refractive index of the cladding layers 12, 14, 15, and 16. If the amplifier is to serve as a STMO amplifier, the thickness and width of active layer 13 should be small enough so that only the fundamental mode is guided. The optical gain spectrum of the amplifier is determined by the bandgap wavelength of layer 13.

In one particular, embodiment of the invention, the LED is a commercially available single transverse mode LED having a peak output at 1.3 microns at a bias current of 30 mA. The peak output shifts to 1.28 microns at a bias current of 60 mA due to semiconductor band filling. The LED is operated in its superluminescent mode with some optical gain for which the half-power width of its optical output spectrum is maintained at about 600 angstroms. The LED is packaged with a single mode fiber that may serve as the optical fiber 4 shown in FIG. 1. Additional details concerning the LED design may be found, for example, in B. D. Patterson et al., IEEE Journal of Quantum Electronics, vol. 30, p. 703, 1994. Details concerning the fabrication of such LEDs can be found, for example, in Kashima et al., Journal of Lightwave Technology, vol. 10, no. 11, p. 1644, 1992. The STMO amplifier 6 employed in this embodiment of the invention has a gain spectrum centered at approximately 1.3 microns and is formed from a channeled substrate buried heterostructure laser having a bulk active region. After coating both the laser facets with an antireflective coating, the gain peak wavelength of the device is near 1.255 microns, as determined from its spontaneous emission spectrum. While the reflectivity of the coating should ideally be zero, reflectivities of about $10^{-3}$ do not substantially degrade performance. The amplifier should have a gain peak wavelength that matches the peak emission wavelength of the LED. Other amplifier structures also may be employed, such as a capped mesa buried heterostructure, for example.

Figure 3:
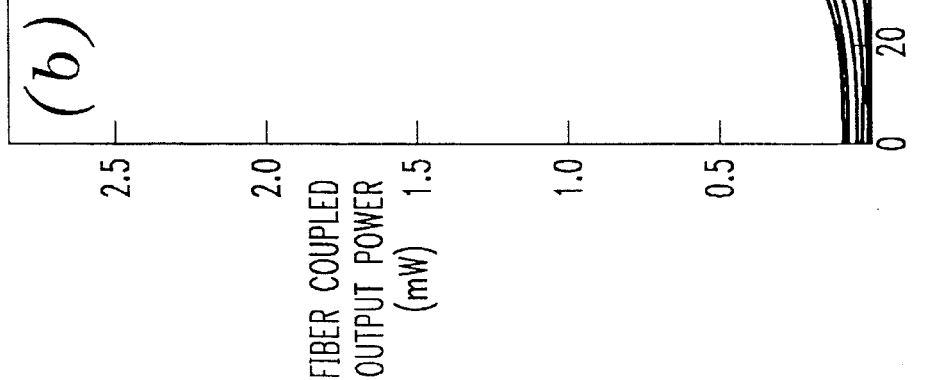
Figure 3:
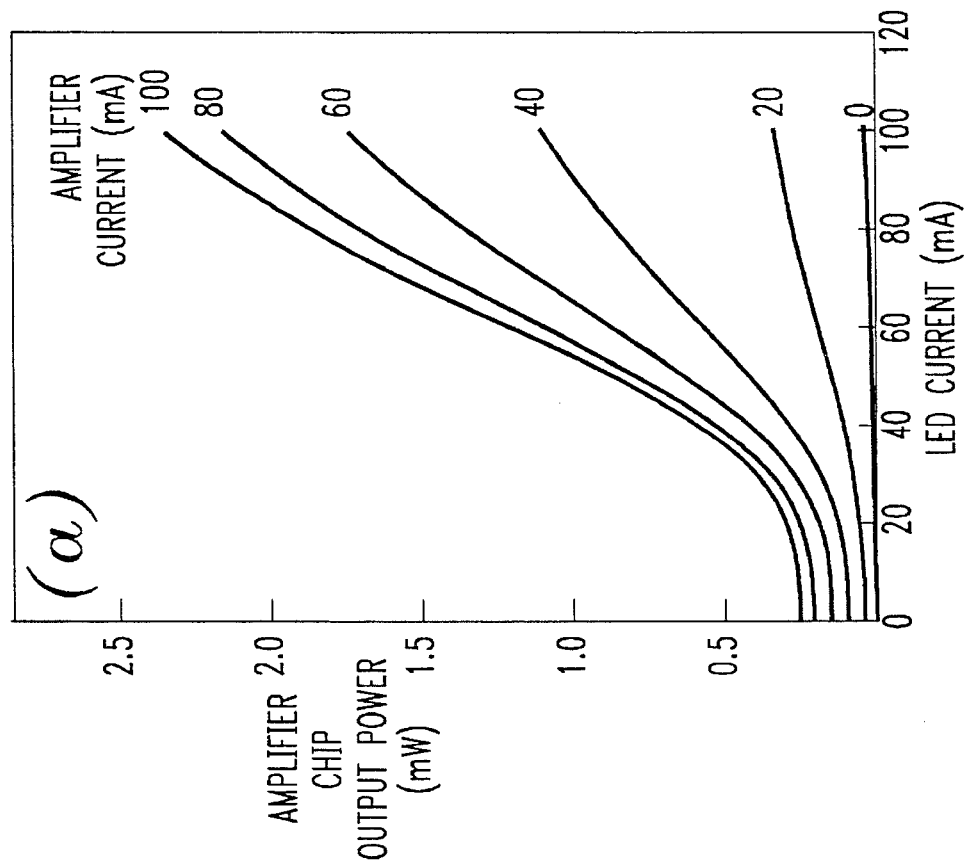
Figure 4:
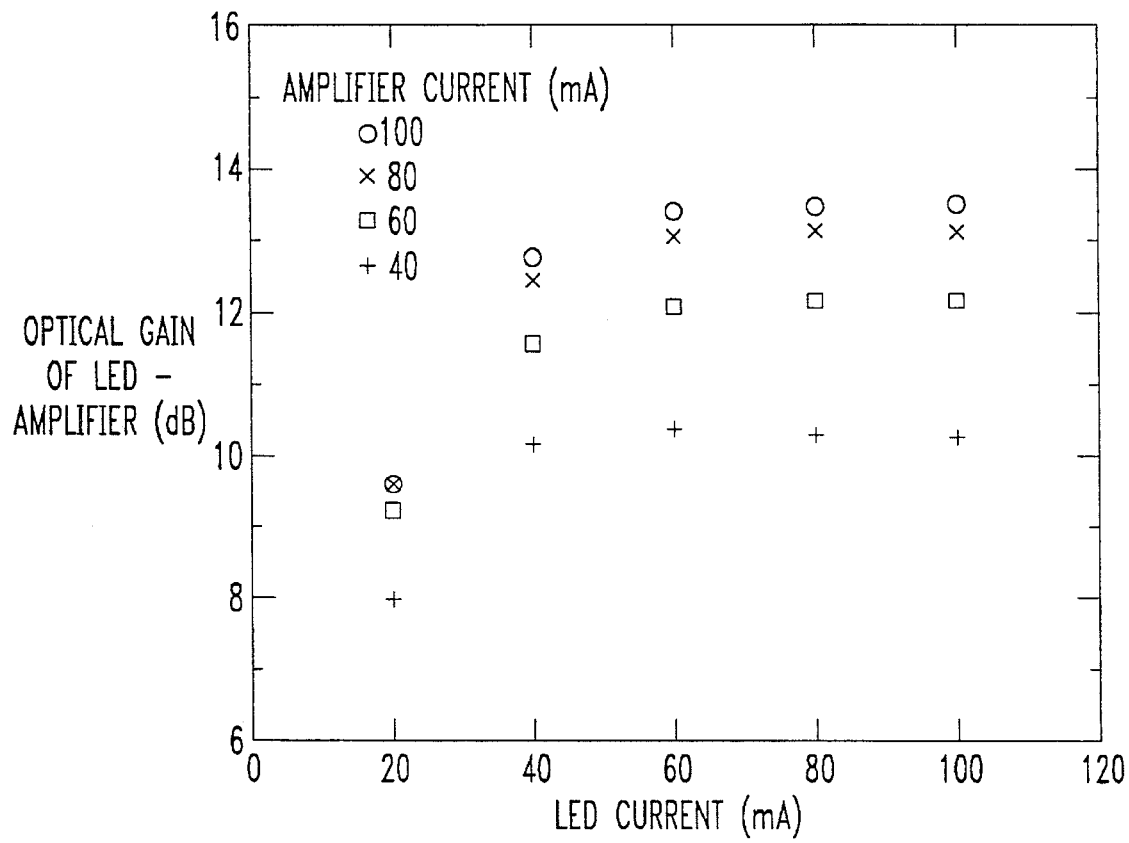
FIG. 4 shows the amplifier gain for various LED and amplifier currents as determined from the data in FIG. 3.
Figure 5:
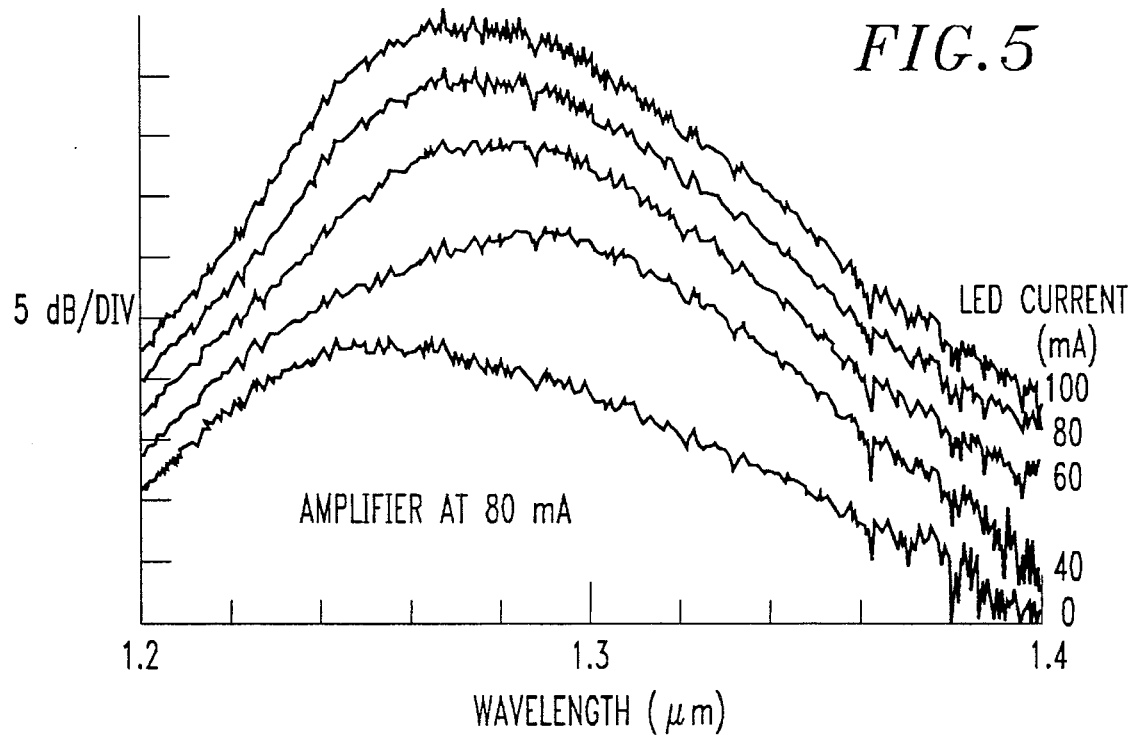
FIG. 5 shows the output optical spectra from the light source of the present invention for various LED currents.

FIG. 3 shows the measured output power versus the LED injection current at various amplifier bias currents for the FIG. 3 device. FIG. 3(a) shows the output power from the amplifier 6 and FIG. 3(b) shows the output after it is coupled to a single mode fiber that is connected to the amplifier output. An amplifier output of 2.3 mW and a fiber output of 1 mW were obtained with the amplifier and the LED both biased at 100 mA, corresponding to a 13.5 dB amplifier gain. The amplifier-to-fiber coupling efficiency was 46%. The light intensity for an LED current of zero is due to the amplified spontaneous emission (ASE) from the amplifier. The amplifier gain of the LED input signal can be determined from FIG. 3 and is shown in FIG. 4. The gain is reduced at low LED currents (near 20 mA) or low LED input power. This reduction is caused by the red shift of the LED spectrum away from the amplifier gain peak. FIG. 5 shows the output spectra for the inventive light source as the LED current is increased to 100 mA while the amplifier is maintained at a bias of 80 mA. The bottom-most spectrum in FIG. 2 shows the spectrum when the LED is unbiased. This curve thus corresponds to the spontaneous spectrum of the amplifier. As the LED current is increased, the output is predominantly composed of the amplified spectrum of the LED.

Figure 6:
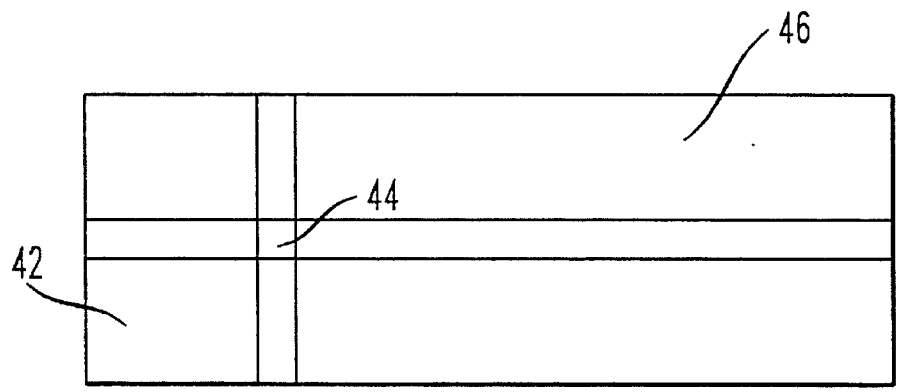
FIG. 6 shows an alternative embodiment of the invention fabricated as a monolithically integrated device.

FIG. 6 shows an alternative embodiment of the invention in which the light source is fabricated as a monolithically integrated device. In this case the LED 42 and the amplifier 46 are fabricated on a common substrate. The output facet of the structure located adjacent to the amplifier should be provided with an AR coating. The facet located adjacent to the LED may be provided with a partial AR coating or optical absorber, if desired. The LED and amplifier may be fabricated in any known structural configuration, including etched mesa buried heterostructures and channeled substrate buried heterostructures. An integrated waveguide 44 replaces the optical fiber 4 and couples the LED 42 to the amplifier 46. The LED 42 is electrically isolated from the amplifier 46. The electrical isolation should be sufficient to ensure that the LED 42 and the amplifier 46 can be biased independently of one another. The LED 42 is also optically coupled to the amplifier 46 with a predetermined amount of optical loss introduced to reduce the coupling efficiency. The degree of optical decoupling should approximately equal the optical loss which occurs between the LED and amplifier when they are fabricated as discrete components, such as in the embodiment of FIG. 1. The optical decoupling should be large enough to suppress laser oscillations and its precise value is dependent on the internal efficiencies of the light source. For instance, an optical loss of approximately 6–8 dB has been found to be sufficient for long wavelength light sources operating at 1.3 and 1.55 microns. If no optical isolation were provided, the device would begin to oscillate, thus exhibiting the characteristics of a laser and not an LED. Optical loss sufficient to achieve the requisite degree of optical decoupling may be introduced by any known means, such as by inserting an optical absorber between the LED 42 and amplifier 46, or by providing the integrated waveguide 44 with a y-branch coupler that removes a predetermined fraction of optical energy. Alternatively, optical loss may be introduced by providing a mode mismatch between the LED 42 and amplifier 46 to radiate away part of the optical power.

Figure 7:
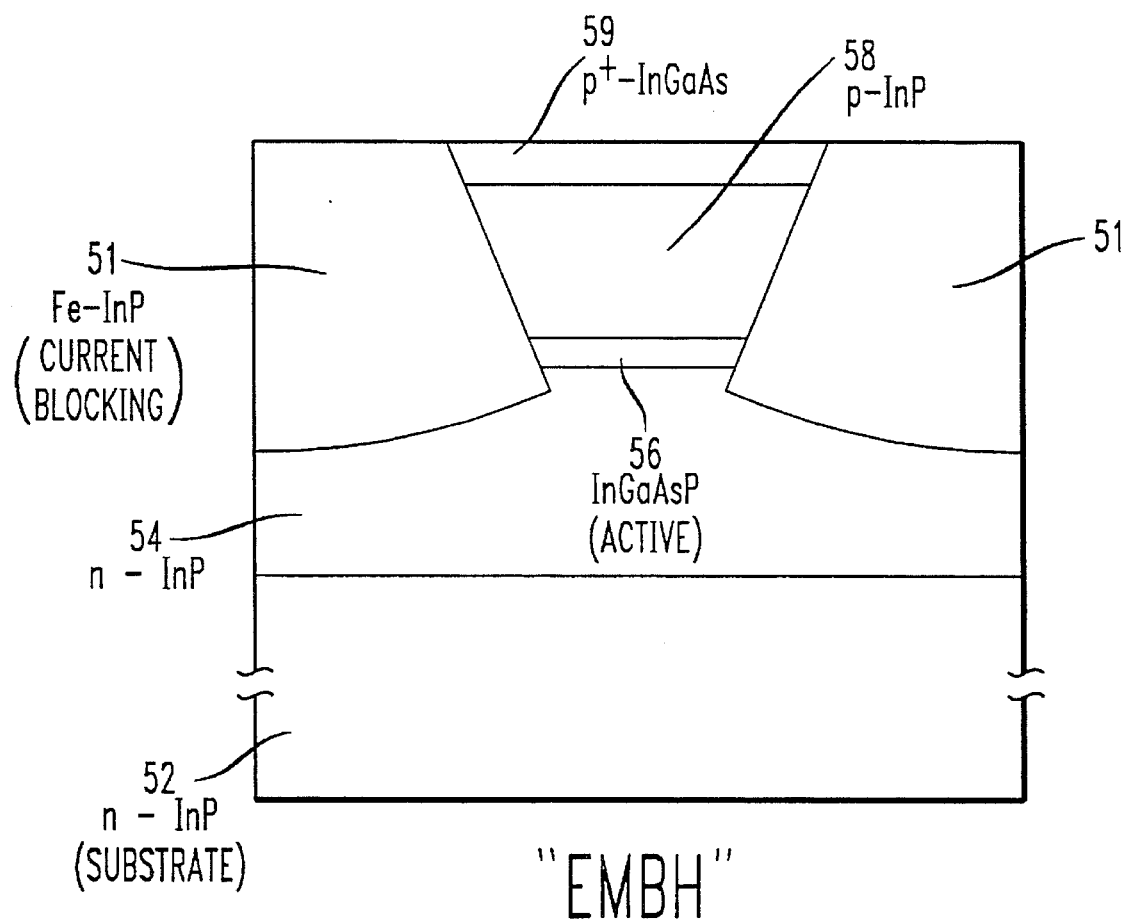
FIG. 7 shows a cross-sectional view of an etched mesa buried heterostructure that may be employed in the embodiment of the invention shown in FIG. 6.

FIG. 7 shows a cross-sectional view of an etched mesa buried heterostructure that may be employed for both the LED 42 and the amplifier 46. The structure includes an n-InP substrate 52 on which an n-InP cladding layer 54 is deposited. A 0.2 micron thick InGaAsP active layer 56 is deposited on the cladding layer 54. A 1.7 micron thick p-InP cladding layer 58 is then deposited on the active layer 56. A 0.1 micron thick p-InGaAs contact layer 59 is deposited on the cladding layer 58. After the above layers have been deposited the structure is etched down into the cladding layer 54 to form a waveguide mesa having a width of about 1.5 microns at the location of the active layer 56. The fabrication process is then continued by depositing a Fe-doped InP semi-insulating layer 51 on both sides of the waveguide mesa. The semi-insulating layer 51 provides both current blocking and optical confinement. Rather than Fe-doped InP, the layer 51 may be fabricated from n-p-n reverse-biased InP layers or a combination of both Fe-doped InP and n-p-n reverse-biased InP layers. The structure is then thinned from the substrate side to a thickness of about 100 microns. Finally, the device is completed by applying appropriate electrical contacts to both surfaces of the device. That is, a p-type contact such as AuZn/Au, for example, should be applied to the topmost layer and an n-type contact such as AuSn/Au should be applied to the substrate. To achieve electrical isolation, the LED and the amplifier should be provided with separate contact pads on the P-side. In addition, the conductive layer 59 should be removed in the region between the LED and the amplifier. When necessary, additional electrical isolation can be achieved by partially etching the portion of the cladding layer 58 located between the LED and the amplifier without etching the underlying waveguide. The active layer 56 may be fabricated as a bulk-like layer as indicated above or alternatively as a series of multiple quantum well layers. Because the optical gain of the device is polarization dependent, a bulk active layer is desirable since it reduces the polarization sensitivity. If the active layer 56 is used for the integrated waveguide 44 and no electrical current is applied to it, waveguide 44 becomes an absorber that provides the optical loss between LED 42 and amplifier 46. The optical loss is given by $e^{-\alpha L}$ where $\alpha$ is the absorption and L is length of waveguide 44. Alternatively, the active layer 56 can be replaced by a passive guide layer and the coupling loss can be provided by a y-branch coupler or a mode mismatch in the waveguide region 44.

The light source of the present invention may be fabricated from any direct bandgap semiconductor ternary or quaternary alloy system whose various alloys can be selected to have lattice constants close to that of the substrate crystal, which may be, for example, GaAs or InP. Material systems for fabricating the light source include, for example, InGaAsP/InP, GaAs/AlGaAs, GaAs/AlAs, InGaAs/InAlAs, InGaAs/InGaAlAs, and GaAsSb/GaAlAsSb. The operating wavelength of devices fabricated from these materials is typically between 0.8 and 1.6 microns. For example, light sources fabricated from InGaAsP/InP typically operate at either 1.3 or 1.55 microns.

I claim:

1. A semiconductor light source comprising:

a light emitting diode;

an optical fiber having a first end coupled to the output of the light emitting diode; and a single transverse mode optical semiconductor amplifier having an input coupled to a second end of the optical fiber.

2. The light source of claim 1 wherein the optical fiber is a single mode optical fiber.

3. The light source of claim 1 wherein the light emitting diode has a peak output at a wavelength of approximately 1.3 microns.

4. The light source of claim 3 wherein the amplifier has a gain spectrum centered at a wavelength of approximately 1.3 microns.

5. The light source of claim 1 wherein the light emitting diode has a peak output at a wavelength of approximately 1.55 microns.

6. The light source of claim 5 wherein the amplifier has a gain spectrum centered at a wavelength of approximately 1.55 microns.

7. The light source of claim 1 wherein the amplifier is a channeled substrate buried heterostructure laser having facets with antireflective coatings for suppressing laser oscillations.

8. The light source of claim 1 wherein the amplifier is a capped mesa buried heterostructure laser having facets with antireflective coatings for suppressing laser oscillations.

9. A monolithically integrated semiconductor light source comprising:

a light emitting diode formed on a substrate;

a waveguide integrated on the substrate and having a first end coupled to the output of the light emitting diode; and a single transverse mode optical semiconductor amplifier formed on the substrate and having an input coupled to a second end of the waveguide.

10. The light source of claim 9 wherein the waveguide is a single mode optical waveguide.

11. The light source of claim 9 wherein said light emitting diode is electrically isolated from the optical amplifier.

12. The light source of claim 11 wherein said light emitting diode is optically coupled to the optical amplifier with a predetermined amount of optical loss.

13. The light source of claim 12 wherein the optical loss is approximately equal to 6–8 db.

14. The light source of claim 12 further comprising an optical absorber formed on the substrate to provide the optical loss.

15. The light source of claim 12 wherein the light emitting diode and the laser are fabricated as etched mesa buried heterostructures.

16. The light source of claim 12 wherein the light emitting diode has a peak output at a wavelength of approximately 1.3 microns.

17. The light source of claim 16 wherein the amplifier has a gain spectrum centered at a wavelength of approximately 1.3 microns.

18. The light source of claim 12 wherein the light emitting diode has a peak output at a wavelength of approximately 1.55 microns.

19. The light source of claim 18 wherein the amplifier has a gain spectrum centered at a wavelength of approximately 1.55 microns.

20. The light source of claim 12 wherein the light emitting diode and the laser are fabricated as capped mesa buried heterostructures.

21. The light source of claim 12 wherein said waveguide includes a y-branch coupler for providing the predetermined amount of optical loss.

22. The light source of claim 12 wherein a mode mismatch is provided between said light emitting diode and said amplifier for providing the predetermined amount of optical loss.

23. The light source of claim 12 wherein an output facet adjacent the amplifier has an antireflective coating.

24. The light source of claim 23 wherein a facet adjacent the LED has a partially antireflective coating.

25. A semiconductor light source comprising:

a light emitting diode;

an optical fiber having a first end coupled to the output of the light emitting diode; and a multiple transverse mode optical semiconductor amplifier having an input coupled to a second end of the optical fiber.

26. The light source of claim 21 wherein the optical fiber is a multiple mode optical fiber.

27. The light source of claim 21 wherein the light emitting diode has a peak output at a wavelength of approximately 1.3 microns.

28. The light source of claim 27 wherein the amplifier has a gain spectrum centered at a wavelength of approximately 1.3 microns.

29. The light source of claim 25 wherein the light emitting diode has a peak output at a wavelength of approximately 1.55 microns.

30. The light source of claim 29 wherein the amplifier has a gain spectrum centered at a wavelength of approximately 1.55 microns.

31. The light source of claim 25 wherein the amplifier is a channeled substrate buried heterostructure laser having facets with antireflective coatings for suppressing laser oscillations.

32. The light source of claim 25 wherein the amplifier is a capped mesa buried heterostructure laser having facets with antireflective coatings for suppressing laser oscillations.

33. A monolithically integrated semiconductor light source comprising:

a light emitting diode formed on a substrate;

a waveguide integrated on the substrate and having a first end coupled to the output of the light emitting diode; and a multiple transverse mode optical semiconductor amplifier formed on the substrate and having an input coupled to a second end of the waveguide.

34. The light source of claim 33 wherein the waveguide is a multiple mode optical waveguide.

35. The light source of claim 33 wherein said light emitting diode is electrically isolated from the optical amplifier.

36. The light source of claim 35 wherein said light emitting diode is optically coupled to the optical amplifier with a predetermined amount of optical loss.

37. The light source of claim 36 wherein the optical loss is approximately equal to 6–8 dB.

38. The light source of claim 36 further comprising an optical absorber formed on the substrate to provide the optical loss.

39. The light source of claim 36 wherein the light emitting diode and the laser are fabricated as etched mesa buried heterostructures.

40. The light source of claim 36 wherein the light emitting diode has a peak output at a wavelength of approximately 1.3 microns.

41. The light source of claim 40 wherein the amplifier has a gain spectrum centered at a wavelength of approximately 1.3 microns.

42. The light source of claim 36 wherein the light emitting diode has a peak output at a wavelength of approximately 1.55 microns.

43. The light source of claim 42 wherein the amplifier has a gain spectrum centered at a wavelength of approximately 1.55 microns.

44. The light source of claim 36 wherein the light emitting diode and the laser are fabricated as capped mesa buried heterostructures.

45. The light source of claim 36 wherein said waveguide includes a y-branch coupler for providing the predetermined amount of optical loss.

46. The light source of claim 36 wherein a mode mismatch is provided between said light emitting diode and said amplifier for providing the predetermined amount of optical loss.

47. The light source of claim 36 wherein an output facet adjacent the amplifier has an antireflective coating.

48. The light source of claim 47 wherein a facet adjacent the LED has a partially antireflective coating.

* * * * *